(12) United States Patent
Yu

(10) Patent No.: US 7,452,763 B1
(45) Date of Patent: Nov. 18, 2008

(54) METHOD FOR A JUNCTION FIELD EFFECT TRANSISTOR WITH REDUCED GATE CAPACITANCE

(75) Inventor: Ho-Yuan Yu, Saratoga, CA (US)

(73) Assignee: Qspeed Semiconductor Inc., Santa Clara, CA (US)

( * ) Notice: Subject to any disclaimer, the term of this patent is extended or adjusted under 35 U.S.C. 154(b) by 0 days.

(21) Appl. No.: 10/776,487

(22) Filed: Feb. 10, 2004

(51) Int. Cl.
*H01L 21/337* (2006.01)
(52) U.S. Cl. .................. 438/186; 438/270
(58) Field of Classification Search .......... 438/135, 438/142, 186, 197, 167, FOR. 163, FOR. 422, 438/FOR. 423, FOR. 424, 242, 268, 270–272, 438/558; 257/134, E29.314, 205, 287, 135
See application file for complete search history.

(56) References Cited

U.S. PATENT DOCUMENTS

| | | | | |
|---|---|---|---|---|
| 4,835,586 | A * | 5/1989 | Cogan et al. | 257/260 |
| 6,144,054 | A * | 11/2000 | Agahi et al. | 257/296 |
| 6,335,239 | B1 * | 1/2002 | Agahi et al. | 438/245 |
| 6,518,623 | B1 * | 2/2003 | Oda et al. | 257/330 |
| 6,551,865 | B2 * | 4/2003 | Kumar et al. | 438/137 |
| 6,696,706 | B1 * | 2/2004 | Pegler | 257/135 |
| 6,764,906 | B2 * | 7/2004 | Darwish | 438/270 |
| 6,777,722 | B1 * | 8/2004 | Yu et al. | 257/134 |
| 6,812,079 | B1 * | 11/2004 | Pegler | 438/186 |
| 6,956,256 | B2 * | 10/2005 | Forbes | 257/278 |
| 6,995,052 | B1 * | 2/2006 | Yu et al. | 438/189 |
| 2002/0115270 | A1 * | 8/2002 | Wu | 438/484 |
| 2002/0167011 | A1 * | 11/2002 | Kumar et al. | 257/77 |
| 2004/0222457 | A1 * | 11/2004 | Kim et al. | 257/328 |
| 2005/0196923 | A1 * | 9/2005 | Deppe et al. | 438/259 |
| 2005/0285177 | A1 * | 12/2005 | Shone | 257/315 |

OTHER PUBLICATIONS

H. Ogiwara, M. Hayakawa, T. Nishimura and M. Nakaoka; "High-Frequency Induction Heating Inverter With Multi-Resonant Mode Using Newly Developed Normally-Off Type Static Induction Transistors"; Department of Electrical Engineering, Ashikaga Institute of Technology, Japan; Department of Electrical Engineering, Oita University, Japan; Department of Electrical Engineering, Kobe University, Japan; pp. 1017-1023.

J. Baliga; "Highvoltage Junction-Gate Field Effect Transistor With Recessed Gates"; IEEE Transactions on Electron Devices; vol. ED-29; No. 10; Oct. 1982.

(Continued)

*Primary Examiner*—Thanh V. Pham
*Assistant Examiner*—Khiem D Nguyen
(74) *Attorney, Agent, or Firm*—Morgan, Lewis & Bockius LLP

(57) ABSTRACT

A method for fabricating a dual gate structure for JFETs and MESFETs and the associated devices. Trenches are etched in a semiconductor substrate for fabrication of a gate structure for a JFET or MESFET. A sidewall spacer may be formed on the walls of the trenches to adjust the lateral dimension for a first gate. Following the formation of the first gate by implantation or deposition, a buffer region is implanted below the first gate using a complementary dopant and a second sidewall spacer with a thickness that may be the same or greater than the thickness of the first sidewall spacer. Subsequent to the buffer implant, a second gate is implanted beneath the buffer layer using a third sidewall spacer with a greater thickness than the first sidewall spacer.

20 Claims, 10 Drawing Sheets

OTHER PUBLICATIONS

J. M. C. Stork et al.; "Small Geometry Depleted Base Bipolar Transistors (BSIT)- VLSI Devices?"; IEEE Transactions on Electron Devices; vol. ED-28; No. 11; Nov. 1981.

Nishizawa et al.; "Analysis of Static Characteristics of a Bipolar Mode Sit (BSIT)"; IEEE Transactions on Electron Devices; vol. ED-29; No. 11; Aug. 1982.

Caruso et al.; "Performance Analysis of a Bipolar Mode Fet (BMFET) With Normally Off Characteristics"; IEEE Transactions on Power Electronics; vol. 3; No. 2; Apr. 1988.

Nishizawa et al.; "Fieldeffect Transistor Versus Analog Transistor (Static Induction Transistor)"; IEEE Transactions on Electron Devices; vol. ED-24; No. 4; Apr. 1975.

* cited by examiner

METHOD FOR A JUNCTION FIELD EFFECT TRANSISTOR WITH REDUCED GATE CAPACITANCE

FIELD OF THE INVENTION

Embodiments of the present invention relate to field effect transistors (FETs). In particular, embodiments of the present invention relate to a gate structure for improved performance characteristics in FETs.

BACKGROUND ART

Junction field effect transistors (JFETs) are majority carrier devices that conduct current through a channel that is controlled by the application of a voltage to a p-n junction. JFETs may be constructed as p-channel or n-channel and may be operated as enhancement mode devices or depletion mode devices. Similar to the JFET is the metal-semiconductor field effect transistor (MESFET). In MESFETs, a junction between a metal and a semiconductor is used to create a Schottky barrier that takes the place of the p-n junction of the JFET.

The most common JFET type is the depletion mode type. The depletion mode device is a "normally on" device that is turned off by reverse biasing the p-n junction so that pinch-off occurs in the conduction channel. P-channel depletion mode devices are turned off by the application of a positive voltage between the gate and source (positive $V_{gs}$), whereas n-channel depletion mode devices are turned off by the application of a negative voltage between the gate and source (negative $V_{gs}$). Since the junction of a depletion mode JFET is reverse biased in normal operation, the input voltage $V_{gs}$ can be relatively high. However, the supply voltage between the drain and source ($V_{ds}$) is usually relatively low when the device is turned on.

Prior Art FIG. 1 shows a general schematic for an n-channel depletion mode JFET with $V_{gs}=V_{ds}=0$. The JFET has two opposed gate regions 10, a drain 11 and source 12. The drain 11 and source 12 are located in the n-doped region of the device and the gates 10 are p-doped. Two p-n junctions are present in the device, each having an associated depletion region 13. A conductive channel region 14 is shown between the two depletion regions 13 associated with the p-n junctions. In operation, the voltage variable width of the depletion regions 13 is used to control the effective cross-sectional area the of conductive channel region 14. The application of a voltage $V_{gs}$ between the gates 10 and source 12 will cause the conductive channel region to vary in width, thereby controlling the resistance between the drain 11 and the source 12. A reverse bias, (e.g., a negative $V_{gs}$), will cause the depletion regions to expand, and at a sufficiently negative value cause the conductive channel to "pinch off", thereby turning off the device.

The width of the depletion regions 13 and the conductive channel region 14 are determined by the width of the n-doped region and the dopant levels in the n-doped and p-doped regions. If the device shown in FIG. 1 were constructed with a narrow n-doped region, such that the two depletion regions merged into a single continuous depletion region and the conductive channel region 14 had zero width, the result would be the device shown in Prior Art FIG. 2.

Enhancement mode, or "normally off" JFETs are characterized by a channel that is sufficiently narrow such that a depletion region at zero applied voltage extends across the entire width of the channel. Application of a forward bias reduces the width of the depletion region in the channel, thereby creating a conduction path in the channel. P-channel enhancement mode JFETs are turned on by the application of a negative $V_{gs}$, and n-channel enhancement mode JFETs are turned on by the application of a positive $V_{gs}$. The input gate voltage of an enhancement mode JFET is limited by the forward voltage of the p-n junction.

Prior Art FIG. 2 shows a general schematic of an n-channel enhancement mode JFET with $V_{gs}=V_{ds}=0$. The enhancement mode device is "normally off" since the conductive channel width is zero due to the extent of the two depletion regions 13B. The application of a sufficient forward bias (e.g. positive $V_{gs}$) to the device of FIG. 2 will cause the depletion regions 13B to contract, thereby opening a conductive channel.

Although the depletion mode and enhancement mode devices shown schematically in FIG. 1 and FIG. 2 are n-channel devices, depletion mode and enhancement mode devices could be constructed with a reversed doping scheme to provide p-channel devices.

JFETs are capable of being driven by low voltages while maintaining excellent breakdown characteristics when compared to MOSFETs. Since there is no insulator associated with gate/drain and gate/source interfaces of a JFET (only a p-n junction), forward bias results in conduction at a voltage that is very low compared to the reverse bias that the device is capable of withstanding. JFETs also have a much greater resistance to damage from electrostatic discharge (ESD) than MOSFETs.

Historically, metal-oxide semiconductor field effect transistors (MOSFETs) have been much more widely used than JFETs, and among JFETs, the depletion mode device has been more widely used than the enhancement mode device. However, the adoption of submicron processes for device fabrication and the resulting higher speeds, lower voltages, and greater current demands in integrated circuits has created new opportunities for the application of JFETs.

As improvements in photolithographic processes has reduced the lateral resolution for device features, the vertical composition of device features (e.g., the gate and its associated p-n junctions) has remained relatively unchanged with respect to processes involving ion implantation and thermal diffusion.

For vertical FET devices, the lack of close control over the device characteristics in the vertical dimension results in longer channel lengths, increased leakage current, and increased parasitic capacitance.

Thus, a need exists for a method that provides improved control over the vertical feature characteristics in JFETs and MESFETs. There is also a need for a gate structure with improved performance characteristics.

SUMMARY OF INVENTION

Accordingly, embodiments of the present invention provide enhanced control over the vertical characteristics of gate structures of JFETs and MESFETs. In embodiments of the present invention, multiple ion implantation steps are used to provide a dual gate structure that reduces the effective channel length, leakage current, and parasitic capacitance in JFETs and MESFETs.

A method for fabricating a dual gate structure for JFET and MESFET devices is disclosed. Trenches are etched in a semiconductor substrate for fabrication of a gate structure for a JFET or MESFET. A sidewall spacer may be formed on the walls of the trenches to adjust the lateral dimension for a first gate. Following the formation of the first gate, a buffer region is implanted below the first gate using a complementary dopant and a second sidewall spacer with a thickness that may be the same or greater than the thickness of the first sidewall spacer. Subsequent to the buffer implant, a second gate is implanted beneath the buffer layer using a third sidewall spacer with a greater thickness than the first sidewall spacer.

In a particular embodiment of the present invention, a JFET is fabricated with two gates. The first gate is implanted at a first implant energy, and a second narrower gate is implanted at a higher implant energy than the first gate. A buffer layer is implanted between the two gates using a dopant that is complementary to the dopant used in the two gates. The first gate is a control gate, and the second gate may be left floating, or may be used as a second control gate.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

Prior Art

Prior Art

DESCRIPTION OF THE PREFERRED EMBODIMENTS

In the following detailed description of the present invention, a dual gate structure and a method for fabricating the structure; numerous specific details are set forth in order to provide a thorough understanding of the present invention. However, it will be obvious to one skilled in the art that the present invention may be practiced without these specific details. In other instances well known methods involving photolithography, ion implantation, deposition and etch, etc., and well known structures such as ohmic contacts and barrier metallization, etc., have not been described in detail so as not to unnecessarily obscure aspects of the present invention.

U.S. patent application Ser. Nos. 10/158,326, "Method and Structure for Reduced Gate Capacitance," (filed May 29, 2002) and No. 10/191,030 "Method and Structure for Double Dose Gate in a JFET," (filed Jul. 2, 2002), are assigned to the assignee of the present invention and describe gate structures and methods of fabricating same. Both applications are hereby incorporated herein by reference.

Figure 1:
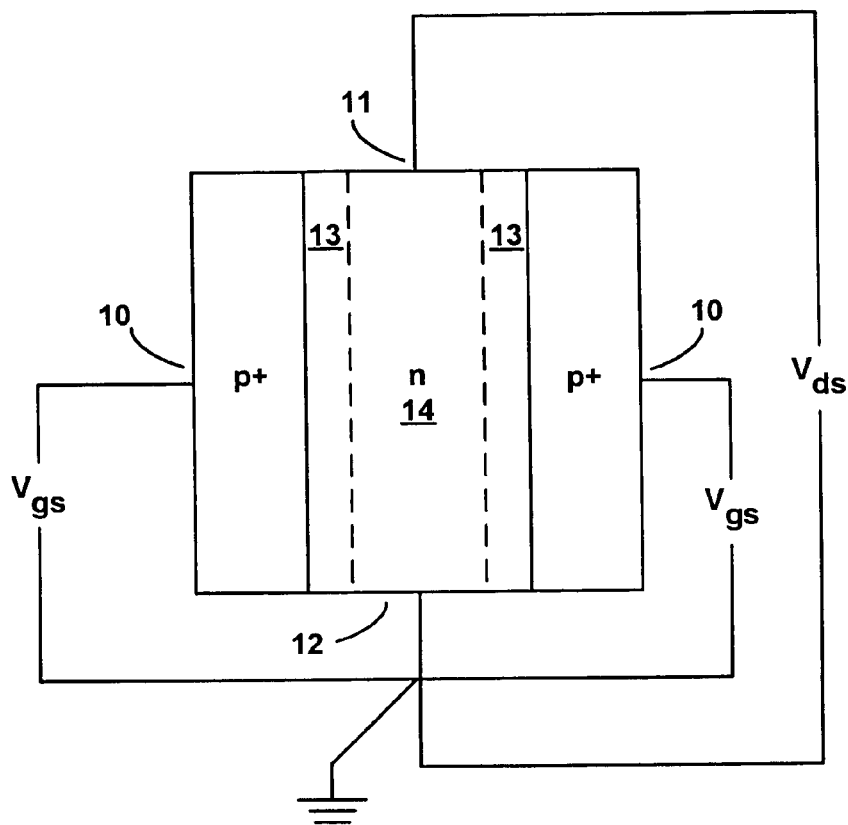
FIG. 1 shows a general schematic for an n-channel depletion mode junction field effect transistor (JFET).
Figure 2:
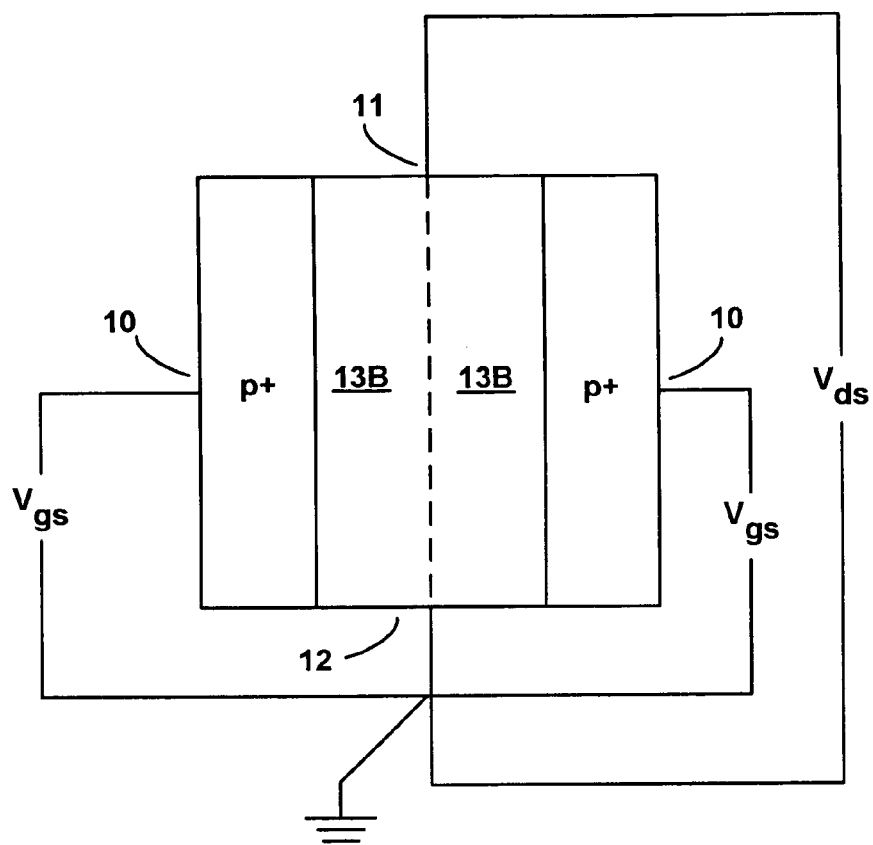
FIG. 2 shows a general schematic for an n-channel enhancement mode junction field effect transistor (JFET).
Figure 3A:
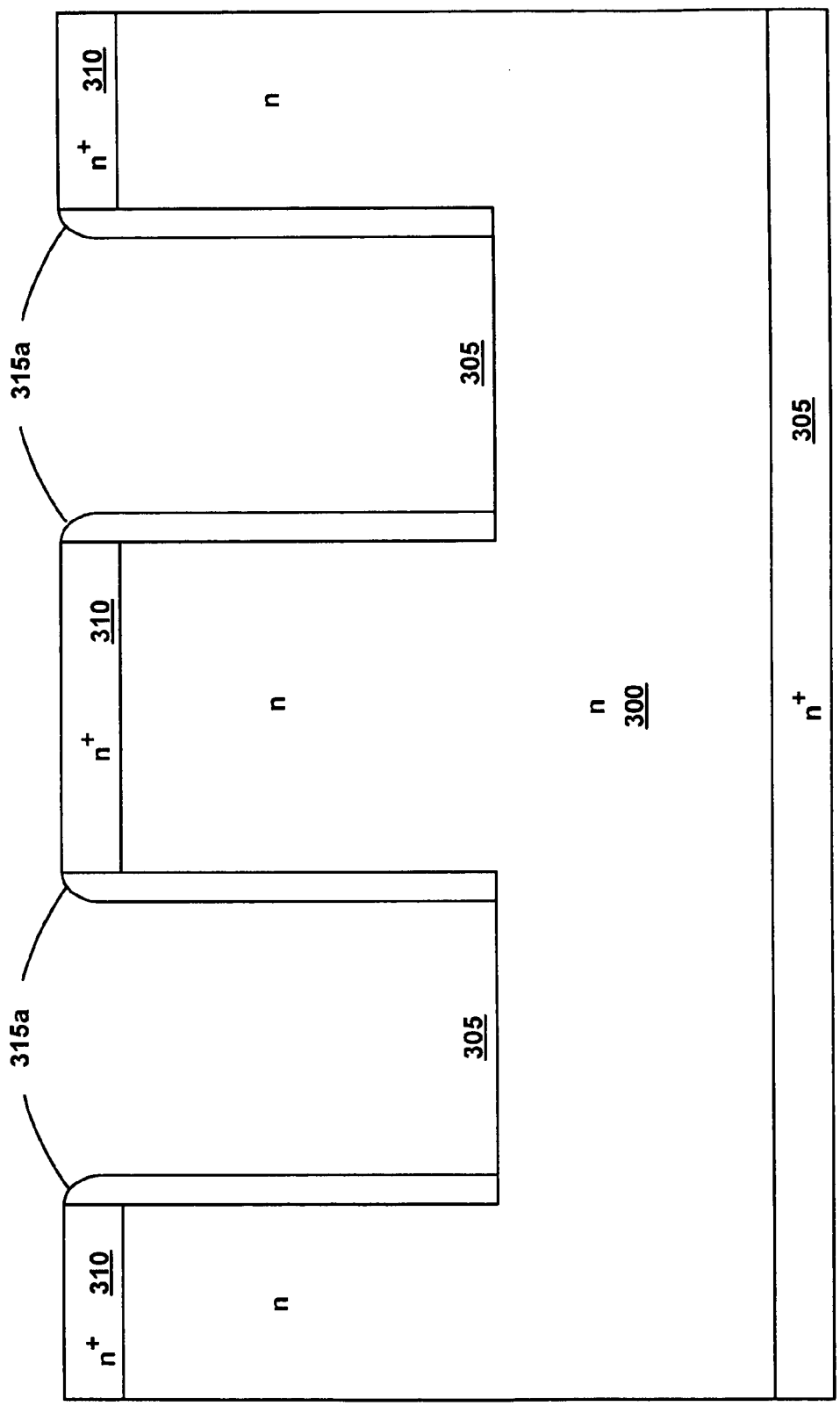
FIG. 3A shows a cross-sectional view of a vertical JFET substrate with trenches and sidewall spacers in accordance with an embodiment of the present claimed invention.

FIG. 3A shows a cross-sectional view of an n-type substrate 300 with trenches 305 and sidewall spacers 315a on the walls of the trenches 305. The sidewall spacers may be thermally grown or deposited. The substrate 300 comprises an $n^+$ layer 310 on the top surface to provide ohmic contact for a drain connection, and an $n^+$ layer 305 on the bottom surface to provide ohmic contact for a source connection. The substrate region between the two adjacent trenches 305 forms the channel region for the JFET. In the present example, silicon is used as a representative semiconductor substrate material. However, other semiconductor materials may be used (e.g., silicon carbide, gallium arsenide, or gallium nitride).

Figure 3B:
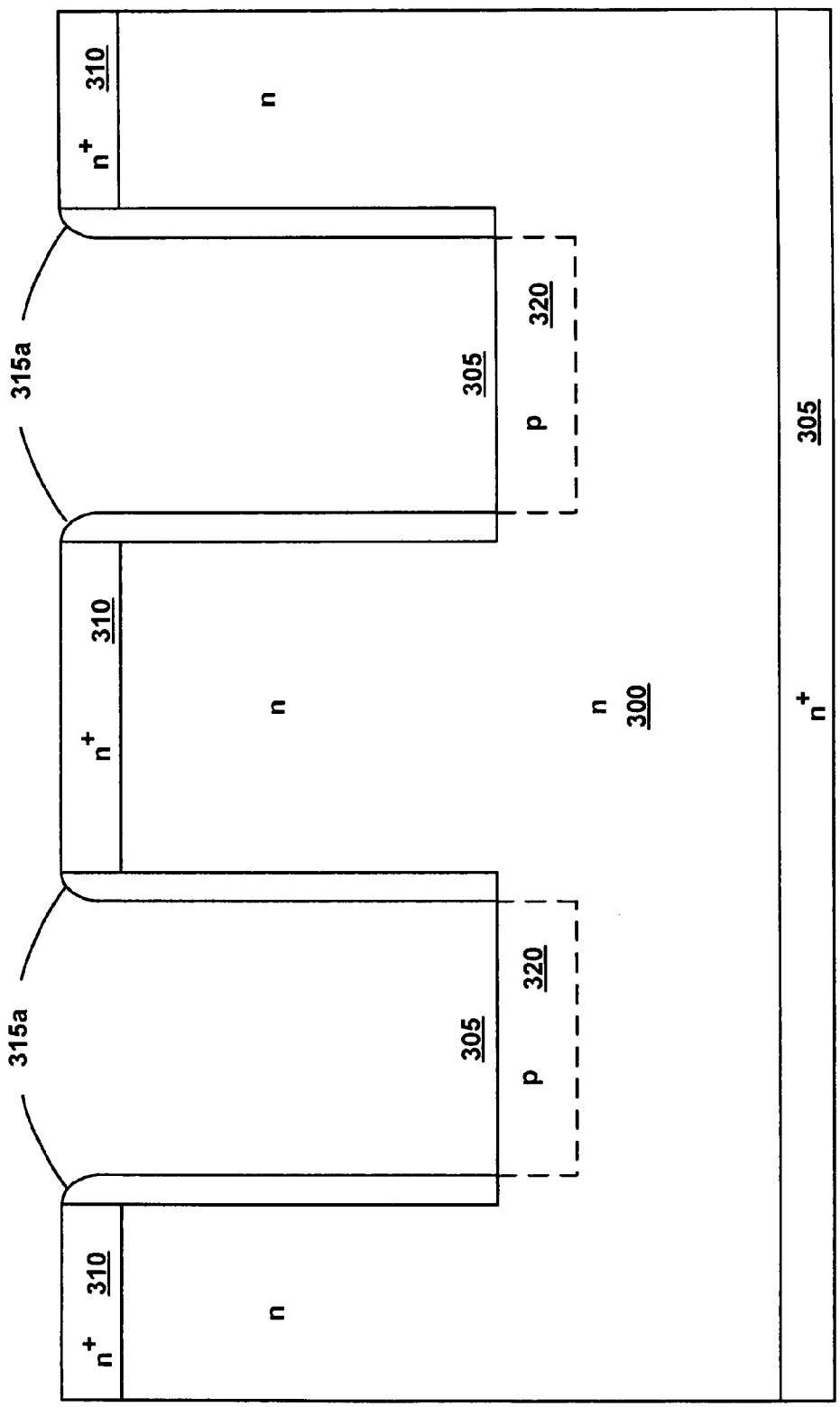
FIG. 3B shows a cross-sectional view of the substrate of FIG. 3A after the formation of a first gate region in accordance with an embodiment of the present claimed invention.

FIG. 3B shows a cross-sectional view of the substrate of FIG. 3A after the formation of a first gate region 320 for a JFET has been formed by low energy ion implantation of a p-type dopant (e.g., boron). Alternatively, a first gate for a MESFET may be formed by deposition of a suitable Schottky barrier metal on the bottom of the trench 305 (see FIG. 3G). The sidewall spacers 315a serve as a mask that establishes the width of the first gate.

Although FIG. 3B shows an n-type substrate and a p-type gate implant, as is used in an n-channel device, a p-type substrate may be used to fabricate a p-channel device. The p-type and n-type dopants are complementary to each other.

Figure 3C:
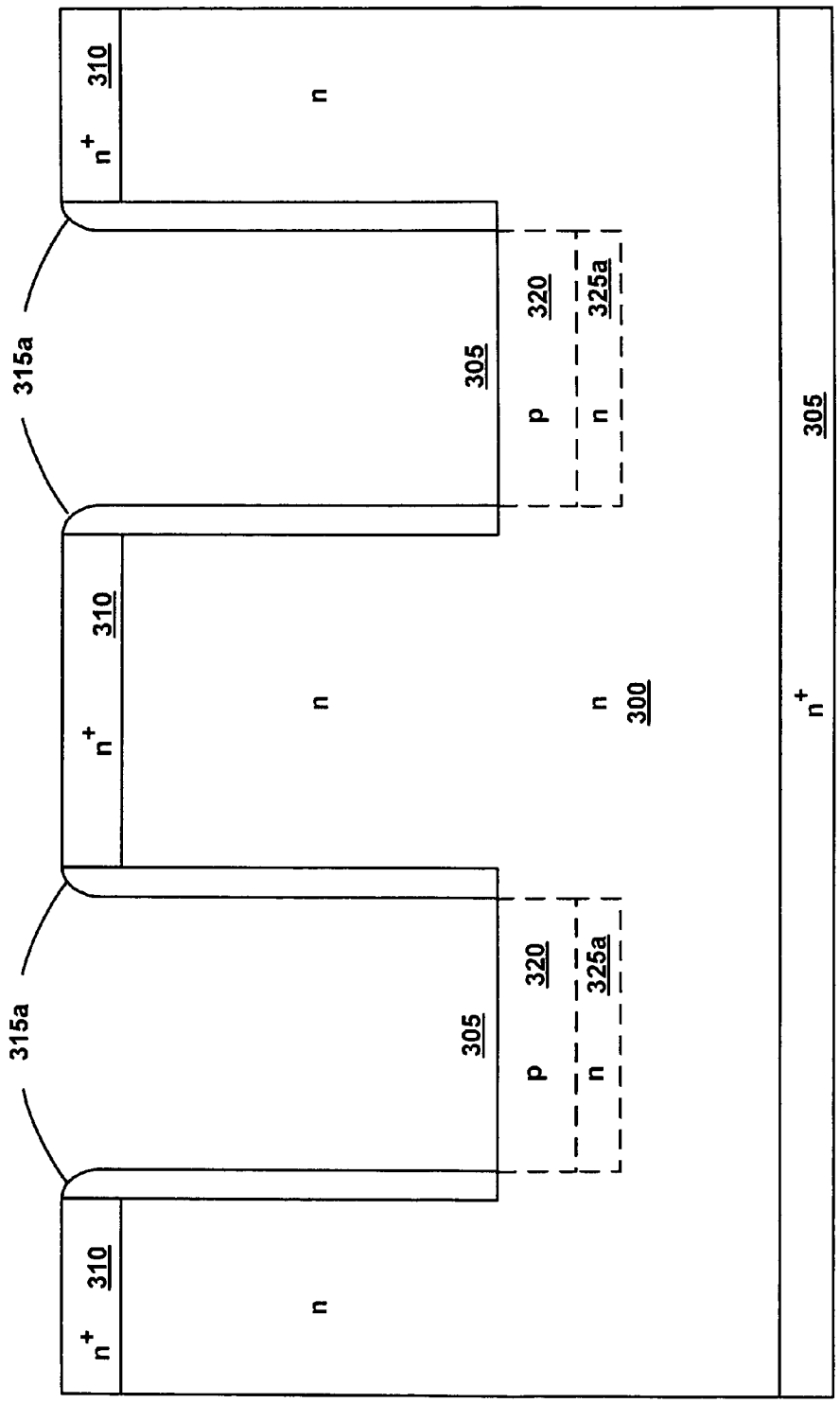
FIG. 3C shows a cross-sectional view of the substrate of FIG. 3B after the formation of a wide buffer layer in accordance with an embodiment of the present claimed invention.

FIG. 3C shows a cross-sectional view of the substrate of FIG. 3B after the implantation of a buffer layer 325a. In this embodiment, the buffer layer 325 implant uses the same spacer 315a that was used for the first gate formation. Thus, the buffer layer implant has essentially the same width as the first gate implant (or Schottky metal).

Buffer layer 325a uses a dopant that of the same type as the substrate 300 (e.g., phosphorus for n-type) and provides additional flexibility in tailoring the characteristics of the first gate p-n junction. The buffer layer 325a may be used to effectively "trim" the first gate and thus reduce the channel length of the first gate.

Figure 3D:
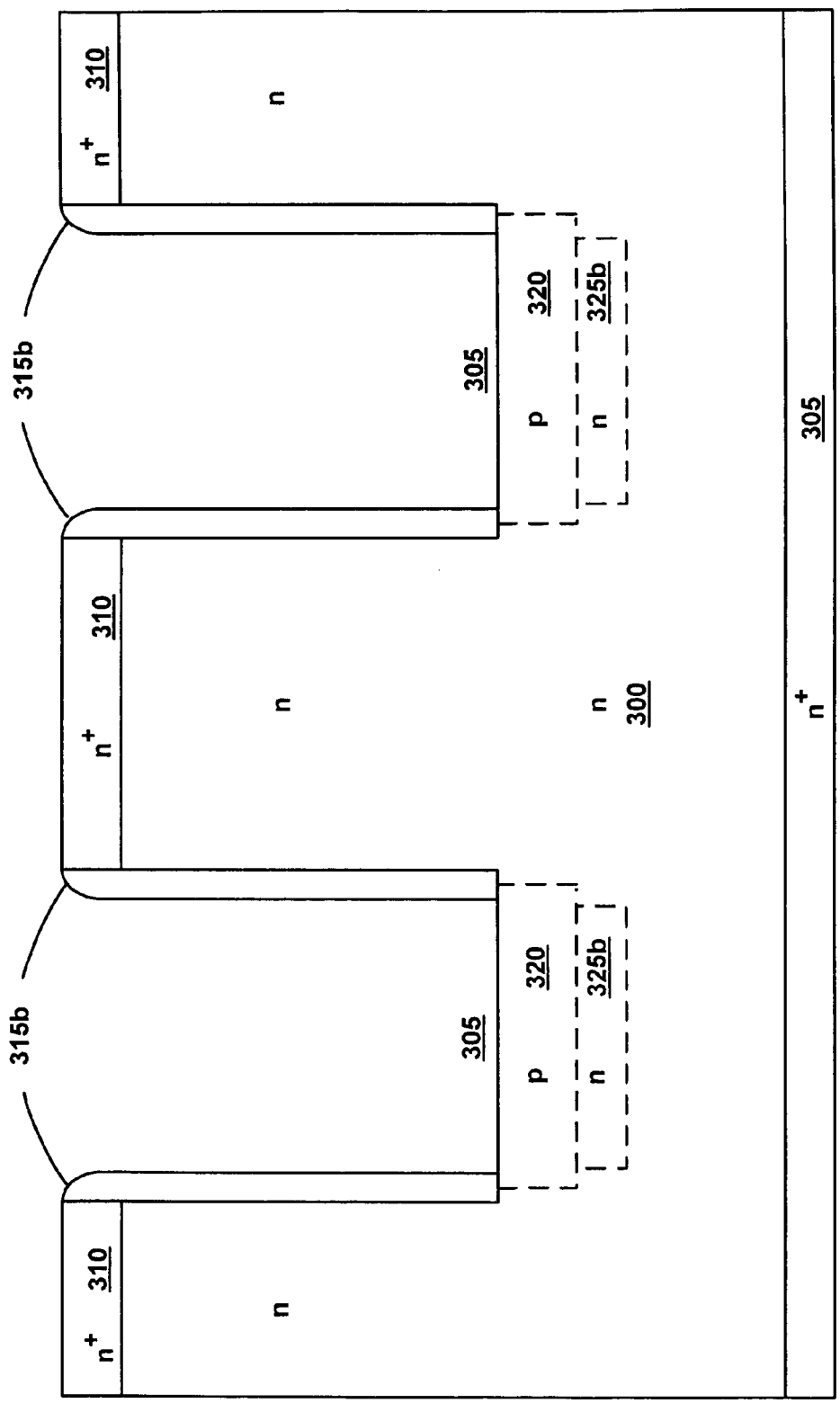
FIG. 3D shows a cross-sectional view of the substrate of FIG. 3B after the formation of a narrow buffer layer in accordance with an embodiment of the present claimed invention.

FIG. 3D shows a cross-sectional view of the substrate 300 after the formation of a narrow buffer layer 325b. The narrow buffer layer is achieved by using a relatively thick spacer 315b.

Figure 3E:
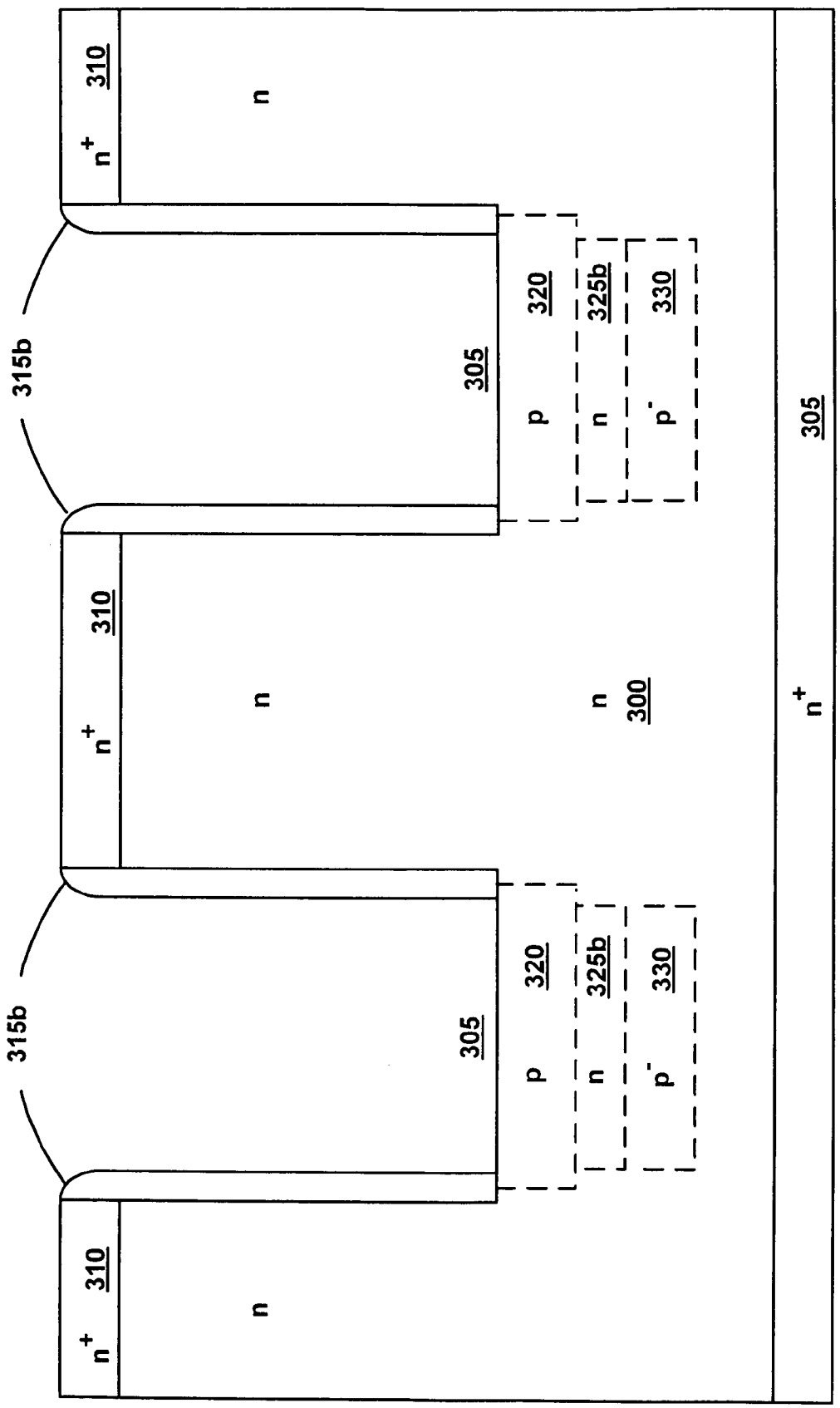
FIG. 3E shows a cross-sectional view of the substrate of FIG. 3D after the formation of a second gate region in accordance with an embodiment of the present claimed invention.

FIG. 3E shows a cross-sectional view of the substrate 300 of FIG. 3D after the formation of a second $p^-$ gate region 330. The second gate region 330 is formed by a high-energy low dose implant (e.g., boron) using a relatively thick spacer 315b. In general, the spacer used for the second gate implant is thicker than the spacer used for the formation of the first gate, and results in the second gate being narrower than the first gate.

The second gate may be connected as a control gate for the FET, or it may be left floating. As a floating gate, the second gate is kept narrow so that unwanted pinch off of the channel through overlapping depletion regions does not occur. The p-n junction associated with the second gate provides an additional gate/drain capacitance ($C_{gd}$) that is in series with the $C_{gd}$ of the first gate, thus reducing the overall $C_{gd}$. The second gate also reduces the overall gate/drain current ($I_{gd}$).

Figure 3F:
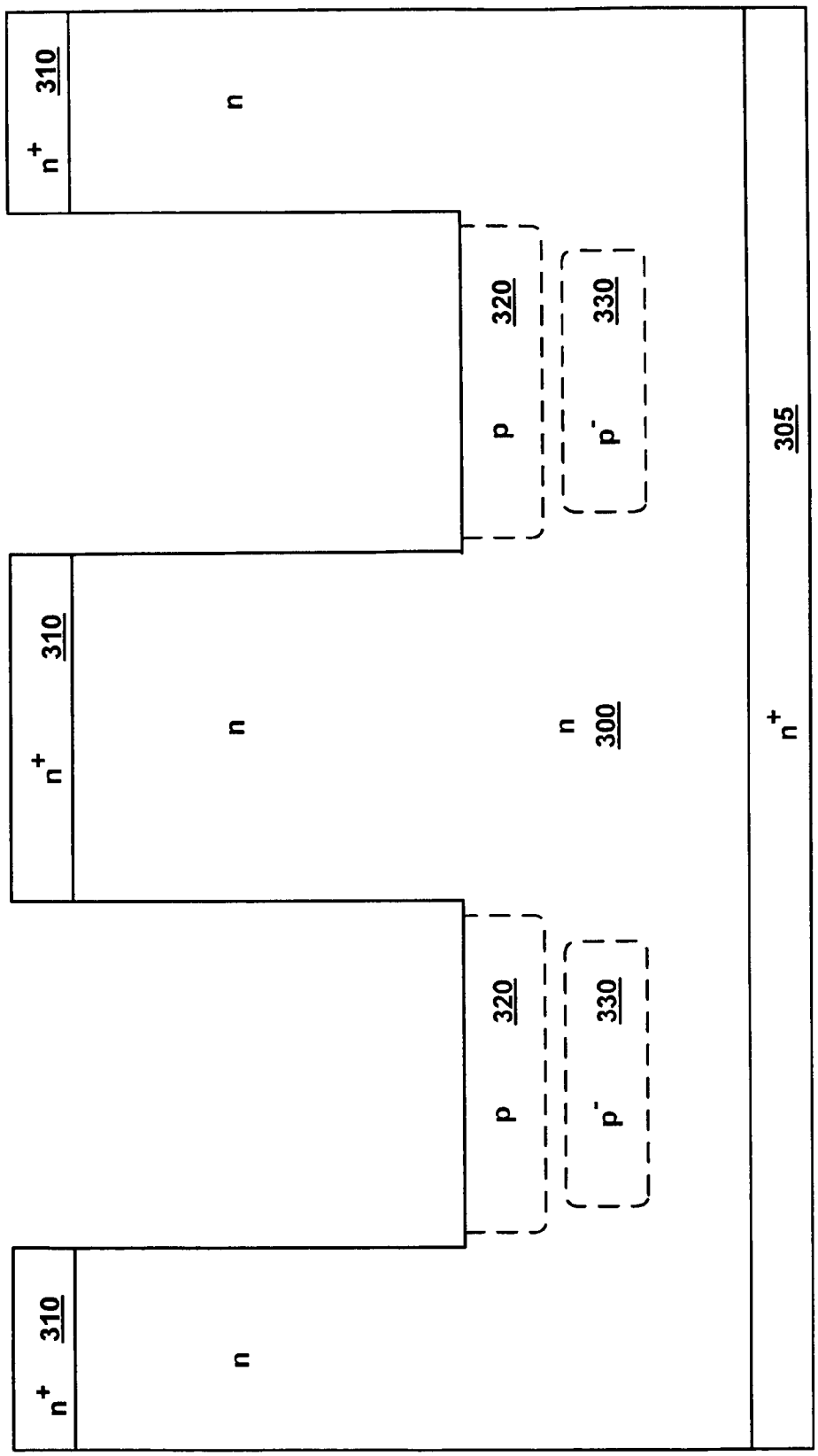
FIG. 3F shows an annealed dual gate JFET structure in accordance with an embodiment of the present claimed invention.

FIG. 3F shows an annealed dual gate JFET structure in accordance with a first gate 320a and a second gate 330a. The dual gate structure shown is the result of three separate implants. The anneal of the implants may be done as a single step after all implants have been made, or the anneal may be done in stages interspersed with the implant steps. The dual gate structure is the result of a superposition of three implant steps, and provides considerable flexibility in tailoring the substrate composition in the vertical dimension to achieve particular performance characteristics for the JFET.

Figure 3G:
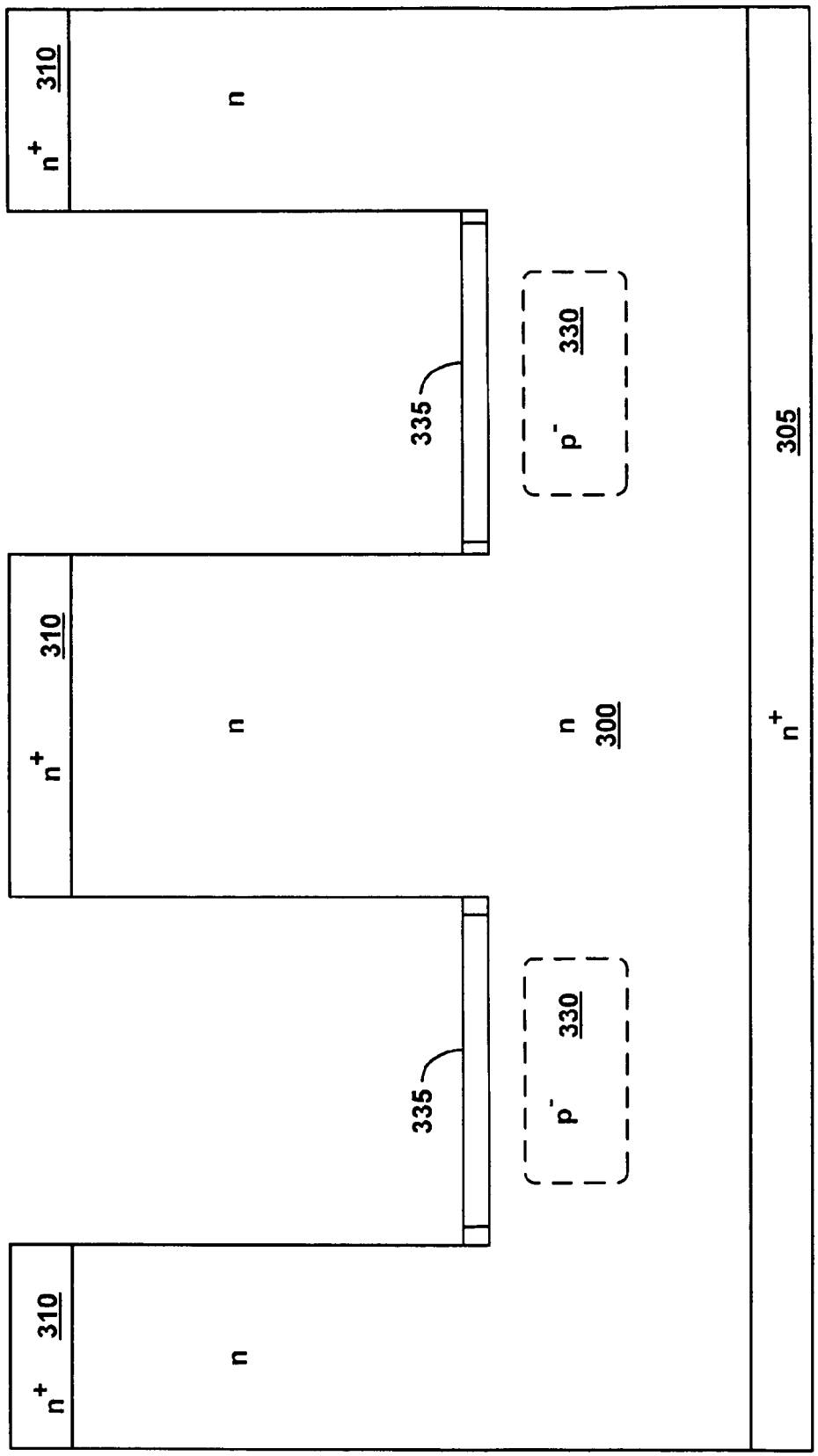
FIG. 3G shows an annealed dual gate MESFET structure in accordance with an embodiment of the present claimed invention.

FIG. 3G shows an annealed dual gate MESFET structure having a deposited first gate 335 and an implanted second gate 330. The MESFET requires only two implants, one for the buffer layer as previously described, and one for the second gate.

Figure 4:
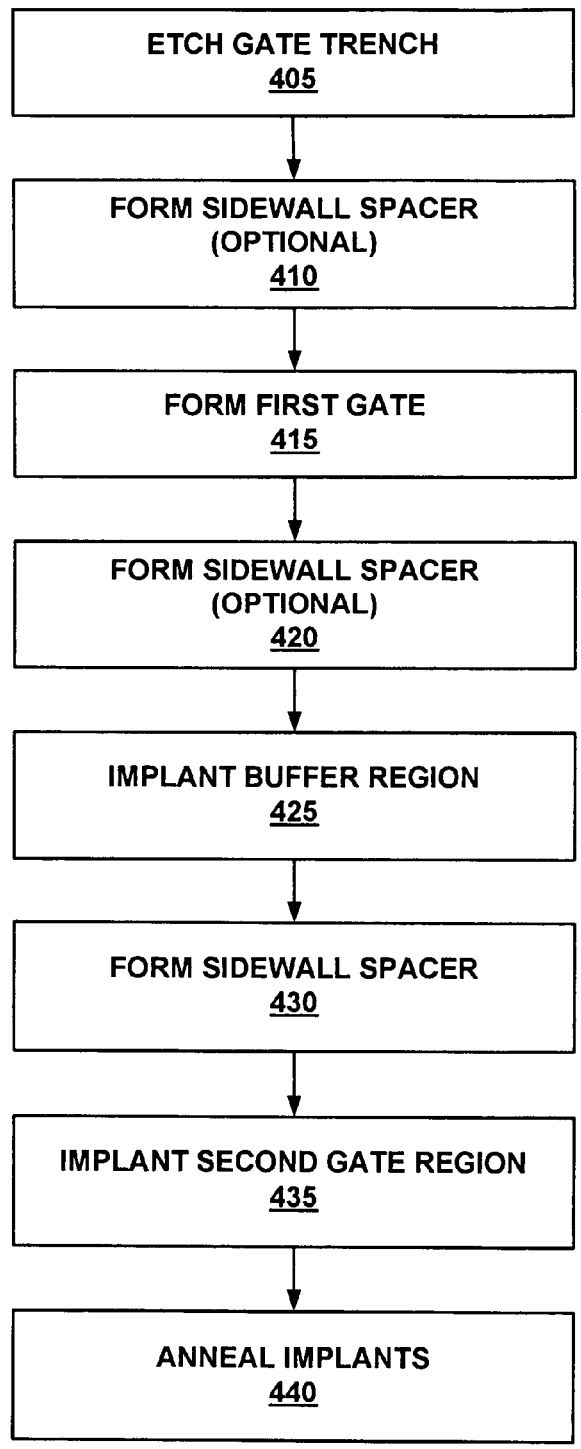
FIG. 4 shows a process flow diagram for fabricating a dual gate structure for a FET in accordance with a method embodiment of the present claimed invention.

FIG. 4 shows a process flow diagram 400 for fabricating a dual gate structure for a JFET or MESFET. In step 405, trenches are etched in the surface of a substrate. In step 410, a sidewall spacer may be formed to establish the width of the region to be implanted for a first gate. In the absence of the sidewall spacer, the width of the implant region is essentially the width of the bottom of the trenches.

In step 415, the first gate is formed. The gate may formed by depositing a metal to form a Schottky barrier on the bottom of the trench (e.g., for a MESFET), or an implant may be done to form a gate region with a p-n junction (e.g., for a JFET).

In step 420, a second sidewall spacer may be formed to establish the width of a buffer region. The second sidewall spacer has a thickness that is greater than or equal to the thickness of the first sidewall spacer.

In step 425, an implant is performed to form a buffer region beneath the first gate. The buffer region is implanted with a dopant that is of the same type as the substrate.

In step 430, a sidewall spacer is formed for defining the width of a second gate. The sidewall spacer for the second gate is thicker than the sidewall spacer used for the first gate.

In step 435, the second gate region is implanted using a high-energy low dose implant. The second implant produces a second gate that is narrower than the first gate and separated from the first gate by the buffer region.

In step 440, the implants are annealed. The anneal may be done after all implants have been performed, or it may be done in stages. Piecewise annealing may be used when the second gate is implanted first, followed by the buffer implant. Once annealed, the deep implant will not be subjected to knock-on damage by subsequent shallower implants.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. For example, there are many combinations of the parameters for the implant and anneal process steps, and their sequencing, that may be used to produce the structures described herein. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

The invention claimed is:

1. A method for fabricating a dual gate structure for a field effect transistor (FET), said method comprising:
   etching a gate trench in a surface of a semiconductor substrate;
   forming a first gate region at the bottom of said gate trench, said first gate region continuous in a lateral direction parallel to said surface;
   implanting a buffer region beneath said first gate region; and
   implanting a second gate region beneath said buffer region, wherein said second gate region is formed entirely beneath said first gate region, and wherein, at a conclusion of implanting said second gate region, said second gate region is continuous in said lateral direction and is narrower than said first gate region.

2. The method of claim 1, further comprising forming a sidewall spacer to establish a width of said first gate region.

3. The method of claim 1, further comprising forming a sidewall spacer to establish a width of said buffer region.

4. The method of claim 1, further comprising forming a sidewall spacer to establish a width of said second gate region.

5. The method of claim 1, further comprising annealing said substrate subsequent to implanting said second gate region.

6. The method of claim 1, further comprising annealing said substrate after said implanting said second gate region.

7. A method for fabricating a dual gate structure for a field effect transistor (FET), said method comprising:
   in sequence,
      etching a gate trench in a surface of a semiconductor substrate;
      forming a first gate region at the bottom of said gate trench;
      implanting a buffer region beneath said first gate region; and
      implanting a second gate region beneath said buffer region, wherein said second gate region is formed entirely beneath said first gate region; wherein said first gate region and said second gate region together form said dual gate structure.

8. The method of claim 7, further comprising forming a sidewall spacer to establish a width of said first gate region.

9. The method of claim 7, further comprising forming a sidewall spacer to establish a width of said buffer region.

10. The method of claim 7, further comprising forming a sidewall spacer to establish a width of said second gate region.

11. The method of claim 7, wherein said first gate region is continuous in a lateral direction parallel to said surface, and said second gate region is continuous in said lateral direction and is narrower than said first gate region.

12. A method for fabricating a dual gate structure for a field effect transistor (FET), said method comprising:
   etching a gate trench in a surface of a semiconductor substrate;
   forming a first gate region at the bottom of said gate trench;
   after forming the first gate region, implanting a buffer region beneath said first gate region; and
   implanting a second gate region beneath said buffer region, wherein said second gate region is formed entirely beneath said first gate region; wherein said first gate region and said second gate region together form said dual gate structure.

13. The method of claim 12, further comprising forming a sidewall spacer to establish a width of said first gate region.

14. The method of claim 12, further comprising forming a sidewall spacer to establish a width of said buffer region.

15. The method of claim 12, further comprising forming a sidewall spacer to establish a width of said second gate region.

16. A method for fabricating a dual gate structure for a field effect transistor (FET), said method comprising:
   etching a gate trench in a surface of a semiconductor substrate;
   forming a first gate region at the bottom of said gate trench;
   implanting a buffer region beneath said first gate region; and after implanting the buffer region, implanting a second gate region beneath said buffer region, wherein said second gate region is formed entirely beneath said first gate region; wherein said first gate region and said second gate region together form said dual gate structure.

17. The method of claim 16, further comprising forming a sidewall spacer to establish a width of said first gate region.

18. The method of claim 16, further comprising forming a sidewall spacer to establish a width of said buffer region.

19. The method of claim 16, further comprising forming a sidewall spacer to establish a width of said second gate region.

20. The method of claim 16, further comprising forming a first sidewall spacer to establish a width of said buffer region, and forming a second sidewall spacer to establish a width of said second gate region, wherein the second sidewall spacer is thicker than the first sidewall spacer.

* * * * *

UNITED STATES PATENT AND TRADEMARK OFFICE
CERTIFICATE OF CORRECTION

| | |
|---|---|
| PATENT NO. | : 7,452,763 B1 |
| APPLICATION NO. | : 10/776487 |
| DATED | : November 18, 2008 |
| INVENTOR(S) | : Yu |

Page 1 of 1

It is certified that error appears in the above-identified patent and that said Letters Patent is hereby corrected as shown below:

On the title page, at Item (62) Related U.S. Application Data:

please insert -- Divisional of application No. 10/382,344, filed on Mar 4, 2003, now Pat. No. 7,038,260 --.

In the Specification:

Col. 1, line 5, before the section "Field of the Invention," please insert as a separate paragraph -- This application is a divisional application of Serial No. 10/382,344, filed on March 4, 2003, now Patent No. 7,038,260. --.

Signed and Sealed this

Twenty-second Day of December, 2009

David J. Kappos
*Director of the United States Patent and Trademark Office*